United States Patent [19]

Bonivich

[11] Patent Number: 4,573,139
[45] Date of Patent: Feb. 25, 1986

[54] SYSTEM FOR POSITION SENSING TRANSDUCERS

[75] Inventor: Paul E. Bonivich, Waynesboro, Va.

[73] Assignee: General Electric Company, Charlottesville, Va.

[21] Appl. No.: 415,744

[22] Filed: Sep. 7, 1982

[51] Int. Cl.[4] .............................................. G06F 3/04
[52] U.S. Cl. .................................... 364/900; 364/167
[58] Field of Search ............... 364/200 MS, 900 MS, 364/167, 174, 175

[56] References Cited

U.S. PATENT DOCUMENTS

| | | | |
|---|---|---|---|
| 4,118,771 | 10/1978 | Pomella et al. | 364/200 |
| 4,138,718 | 2/1979 | Toke et al. | 364/900 |
| 4,200,936 | 4/1980 | Borzcik et al. | 364/900 |
| 4,275,455 | 6/1981 | Bartlett | 364/900 |
| 4,475,154 | 10/1984 | Kunz | 364/167 |
| 4,495,453 | 1/1985 | Inaba et al. | 364/167 |

Primary Examiner—Gareth D. Shaw
Assistant Examiner—Daniel K. Dorsey
Attorney, Agent, or Firm—Ormand R. Austin

[57] ABSTRACT

An interfacing system for selectably interfacing signals to a computer, or other control apparatus such as a numerical control system, from either of alternative transducers which provide position indicative signals differing in format. A system according to the invention is useful for interfacing signals to a control system from either a resolver or an encoder and includes a digital counter whose output count, irrespective of the transducer type, is indicative of the monitored object's position. A data latch connected between the control or receiving instrumentation and the counter holds a count at an appropriate time and then provides a transfer of the position indicative count to the receiving instrumentation. Circuitry is included for automatically causing the counter to function as a reversing counter or as a reference counter, depending on the type of transducer signals to be interfaced.

12 Claims, 6 Drawing Figures

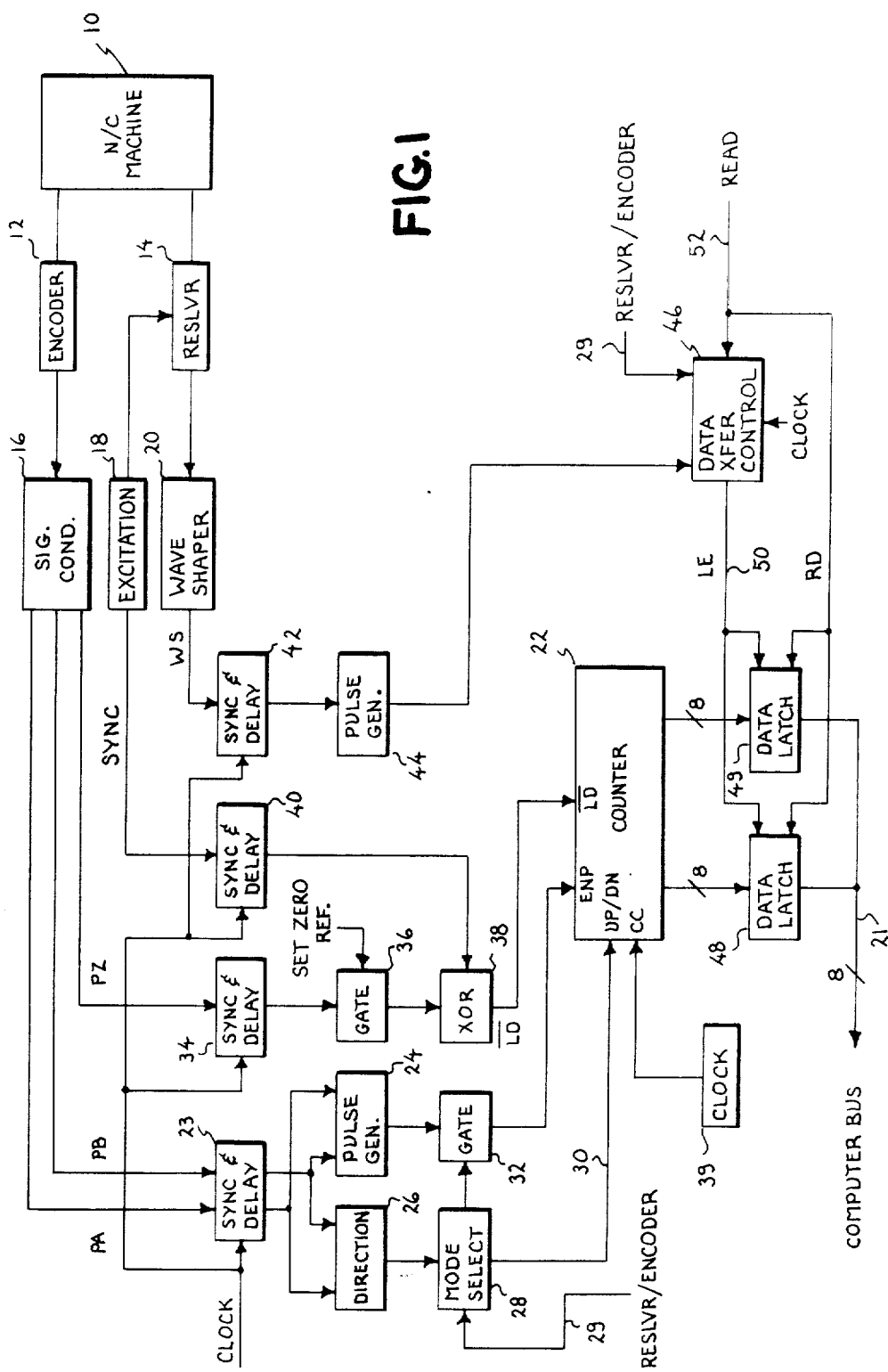

SYSTEM FOR POSITION SENSING TRANSDUCERS

This invention relates generally to means for interfacing externally generated signals to computing and control instrumentation, and in particular to circuitry for interfacing signals from alternative position sensing transducers of various types to a numerical control system, computer, or other instrumentation.

BACKGROUND OF THE INVENTION

It is frequently necessary in a number of endeavors to very accurately determine the relative position of an object and to relate the determined position to a control system or a computer so that appropriate action, based on the perceived position, can be taken. For example, with a numerically controlled machine tool, it is imperative that the working tool's position with respect to some reference location be continuously and accurately determined. Position determining transducers of various kinds are, of course, well known, and for numerical control applications, position transducers are commonly either of the encoder type or the resolver type. These devices may be responsive to either linear changes in position or to angular changes such as the angular change in a shaft's position.

The position indicative signals produced by these different types of devices are considerably different in form, however. Thus, in presenting the signals to a control system, or other instrumentation, each set of signals must be interfaced differently in order to present the signals in a form compatible to receiving instrumentation regardless of the transducer type. Conventionally, two essentially separate and distinct interfacing systems have been employed, in a sense providing two totally separate input channels into the receiving instrumentation. In the numerical control field particularly, some means has been sought by those of skill in the art whereby position sensing transducers of alternative types could be readily interfaced to the computer bus system of the controller without requiring complex, separate circuit paths and wherein an economy of circuitry is attained by using signal handling components common to the alternative transducers notwithstanding the difference in signal format.

Accordingly, it is an object of the present invention to provide apparatus for interfacing position sensing transducers of alternate types to a computer bus system, or to other instrumentation, in satisfaction of those problems and requirements outlined above. A more particular object, however, is to provide circuitry which allows either a position transducer of the encoder type or of the resolver type to be conveniently and economically interfaced to a numerical control system.

SUMMARY OF THE INVENTION

In a preferred form, the present invention provides an interfacing system for selectively interfacing signals to a control computer of a numerical control system from either an encoder or a resolver, either of which is disposed to monitor the position of an object whose position is controlled by the numerical control system.

The system includes a digital counter, operable in a first mode as a reversing counter when signals from the encoder are to be interfaced, and operable in a second mode as a reference counter when signals from the resolver are to be interfaced; a data latch connected between the counter and the control computer for receiving the count from the counter and for holding it to be read by the computer; circuitry operative in the encoder mode to produce a count signal whereby each count is indicative of a change in position as sensed by the encoder, and to produce a signal indicative of the direction of motion sensed by the encoder; circuitry operative in the resolver mode to cause the counter to be reset to zero on the occurrence of a reference signal from the resolver circuitry, and operative to cause the data latch to obtain and hold the count value which occurs substantially simultaneously with a position indicative signal from the resolver circuitry; and data transfer control circuitry to latch and hold the count value from the counter at an appropriate time and then to allow the computer to read the count upon command from the computer.

The counter provides a count value in each mode which is indicative of the present position of the monitored object.

BRIEF DESCRIPTION OF THE DRAWINGS

While the specification concludes with claims particularly pointing out and distinctly claiming subject matter regarded as the invention, the invention will be better understood from the following description taken in connection with the accompanying drawings in which:

FIG. 1 is a block diagram of a preferred form of an interfacing system in accordance with the invention;

DETAILED DESCRIPTION

Figure 2A:
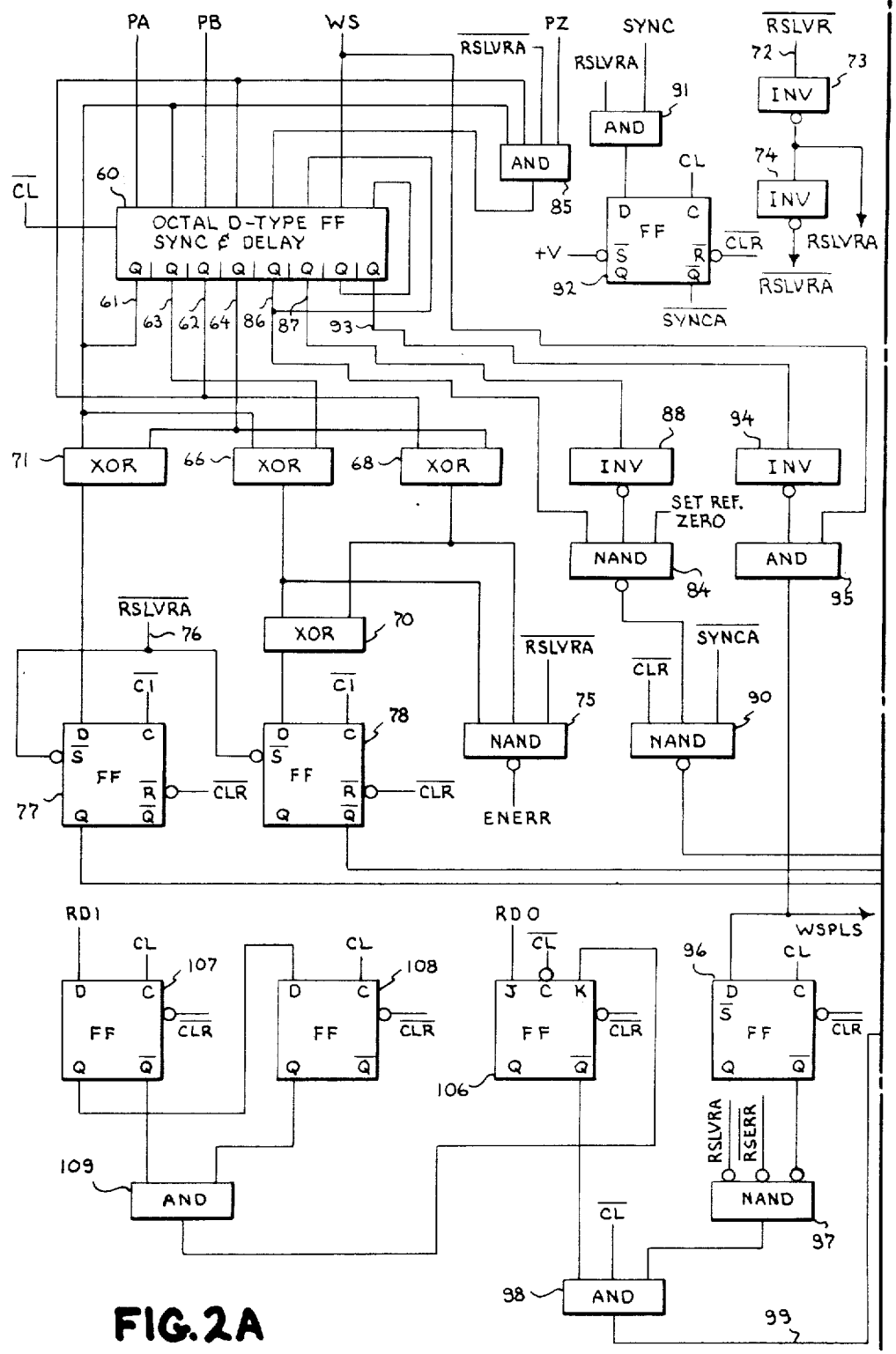
FIGS. 2A and 2B, taken together, provide a schematic circuit diagram of a portion of the interfacing system in accordance with the invention as illustrated in FIG. 1.

In FIG. 1, a numerically controlled machine 10 is illustrated which may, for example, be a machine tool directed to machining operations on some particular workpiece. Shown connected to the machine 10 are a pair of position transducers 12 and 14, one of which is an encoder (item 12) and the other of which is a resolver (item 14). Although two transducers of different types are shown connected to one machine in order to facilitate a description of the invention, it will be recognized that, in practice, generally only one type of transducer or the other will be in use at any given time. Further, the transducers 12 and 14 may either be of a type which responds to linear displacements or to angular, or rotary, displacements; the present invention being suitable for operation with either type. The transducers 12 and 14 may be disposed to indicate displacement of a cutting tool, for example, or of some other component of the machine tool 10.

The signals provided by the two types of transducers are considerably different in format. The encoder provides three separate signals in what is conventionally termed "A quad B" format, i.e., there is a phase A signal, PA; a phase B signal, PB; and a phase Z signal, PZ. Position is determined from these signals by keeping track of the number of amplitude transitions of the PA and PB signals while their phase relationship denotes the direction of displacement. The PZ signal provides a reference marker, and for a rotary encoder, for example, is simply a single pulse which occurs once every revolution of the encoder shaft. The encoder signals are substantially square at their leading and trailing edges but are preferably improved by "squaring up" as in signal conditioner 16 of FIG. 1.

The resolver 14 produces an output signal whose phase relationship with respect to a reference signal is indicative of position. Thus, in FIG. 1 the resolver 14 is excited by a signal from an exciter unit 18 which also provides the reference, or "sync" signal against which the phase of the resolver output signal is compared. The output of the resolver is taken through a wave shaping network 20 to produce a wave shaped signal WS. The excitation signals to the resolver, and hence the sync and WS signals, may for instance, be at a frequency of about 3K Hz.

Position indicative signals from either the encoder 12 or the resolver 14 are interfaced (in a different format, of course) to a computer bus 21 which serves as a conduit for exchanging information with a computer contained in the numerical control system for machine tool 10. At this point, it may be noted that the position information generated by the transducers 12 and 14 (depending on which is in use) is transferred to the data bus 21 from a digital counter 22 which is operable in either a reversing counting mode or a reference counting mode, depending on whether the position information is obtained from the encoder 12 or from the resolver 14. This feature will be more fully described herein below. Initially, however, signal handling circuitry for the two input transducers will be described, proceeding first with signals from the encoder 12.

The PA and PB signals are first clocked through a sync and delay network 23 to provide synchronized and delayed forms of the input PA and PB signals. From these signals, pulse generator 24 provides a string of pulses in which each pulse marks an amplitude transition of the PA and PB input signals. Simultaneously, direction sensing network 26 provides an output signal (based on the phase relationship of the delayed and synced input signals) which is indicative of the direction of motion of the monitored device.

Mode select circuitry 28 is responsive to an input selection (made at input line 29 based on whether the encoder 12 or the resolver 14 is to be interfaced) to produce an output signal on line 30 which directs counter 22 to operate in a first mode (encoder) as an up/down counter or in the second mode (resolver) as a reference counter. The input selection may be made by manual switch, a wiring jumper, or any similar suitable means.

For an encoder input, the direction signals produced in direction sensing network 26 are passed substantially unchanged through the mode select circuitry 28 and are used to direct the counter 22 to count up or down as a function of the direction of movement sensed by the encoder 12.

A gate circuit 32, controlled by a signal from the mode select network 28, passes the transition indicative pulses from pulse generator 24 to an enabling input of the counter 22. These pulses are either counted up or down by the counter 22 (as directed by the signal from direction sensing network 26) in accord with the motion responded to by the encoder 12. Having initially been cleared (as will be described herein below), the counter 22 thus contains a count value which is at all times indicative of the present position of the tool or object being monitored.

The marker signal, PZ, allows a zero reference point to be established from which displacements may be measured. The PZ signal is a periodically occurring pulse which is clocked through a sync and delay circuit 34 to provide a marker pulse of appropriate time duration. The marker pulse is passed through gate 36 whenever a permissive "Set Zero Ref." signal is supplied to the other input of the gate 36. If operation is in the encoder mode, the exclusive OR gate 38 provides an output signal $\overline{\text{LD}}$ which causes the counter to be reset to zero, thus providing a reference point. As the positioned object moves away from the reference point, the count in present position counter 22 is increased; as the object moves toward the reference point, the count is decreased. The "Set Zero Ref." signal is generally initiated by operating personnel and may be used during an initial setup of the machine 10.

When in the resolver mode, on the other hand, mode select circuit 28 blocks the signal from direction sensing network 26 and provides a signal on line 30 forcing counter 22 to remain in the up-counting mode. Simultaneously, the state of gate 32 is fixed such that it provides an enabling signal to counter 22 at the ENP input. Counter 22 thus is in a reference counting mode in which it counts the signal from the system clock 39, applied at the CC input terminal.

Also, while in the resolver mode, sync pulses at a fixed rate from the resolver excitation circuit 18 are passed through a synchronizing and delay circuit 40 to achieve proper signal timing and to create pulses of appropriate time duration. The synchronized pulses are applied to exclusive OR gate 38 which passes an $\overline{\text{LD}}$ signal to the counter 22, resetting it to zero. Thus, in the resolver mode, the counter 22 is repeatedly reset to zero upon occurrence of the resolver sync signal and is then allowed to count up on the clock signal until the counter reaches a predetermined count substantially coincident with the reoccurrence of the sync signal. The counter 22 is then reset to zero. As an example, the timing and frequency relationship of the various signals (e.g., the clock and sync signals) may be such that the counter counts to 3999 and then is reset to zero. Thus, for a rotary resolver, for example, the 360° of revolution is divided into 4000 parts.

For the resolver mode, the count present in the counter 22 at the occurrence of the WS signal is that count which is indicative of the monitored position. In this regard, it will be recalled that the phase separation between the WS signal and the sync signal is indicative of position. Thus, the number of clock pulses accumulated in the counter 22 at the time of the WS signal represents the time interval between the sync and WS signals and is indicative of the monitored position. The WS signal is therefore used to latch the value of the counter 22 as a measure of position.

The WS signal is initially synchronized in sync circuit 42 followed by the derivation of a WS control signal which is produced in pulse generator 44. The control signal, acting through a data transfer control circuit 46, causes the count present in the counter 22 to be latched in a pair of data latches 48 and 49 from which it is transferred to the computer bus 21. As will become apparent, the manner in which the data latches 48 and 49 are controlled differs, depending on whether the encoder 12 or the resolver 14 is being used.

In the encoder mode the data latches 48 and 49 are enabled each clock cycle via line 50 from the data transfer control circuit 46. The count in the latches 48 and 49 therefore tracks that of the counter 22. Upon the occurrence of a READ signal at line 52, however, the count is latched and tranferred to the central computer via the computer bus 21. For the resolver mode, the data is latched except when the latches 48 and 49 are enabled by the occurrence of the WS signal at which time the latches acquire a new count from the counter 22 and immediately latch that count in. A READ signal on line 52 in the resolver mode also causes the latched data to be transferred on to the computer bus 21.

During the READ cycle, the data transfer control 46 maintains the latches 48 and 49 in a latched state to prevent acquisition of a new count at that time from the counter. Preferably, the READ signal is supplied by the computer of the control system to which the position information is to be supplied, and may occur at a periodic rate.

As illustrated, the data is deemed to be transferred to the computer bus in two bytes; one byte from each of the two data latches 48 and 49. It will be noted that, in both modes, the "present position" is obtained by periodically latching the counter value into the present position latch and reading the latch.

Figure 2B:
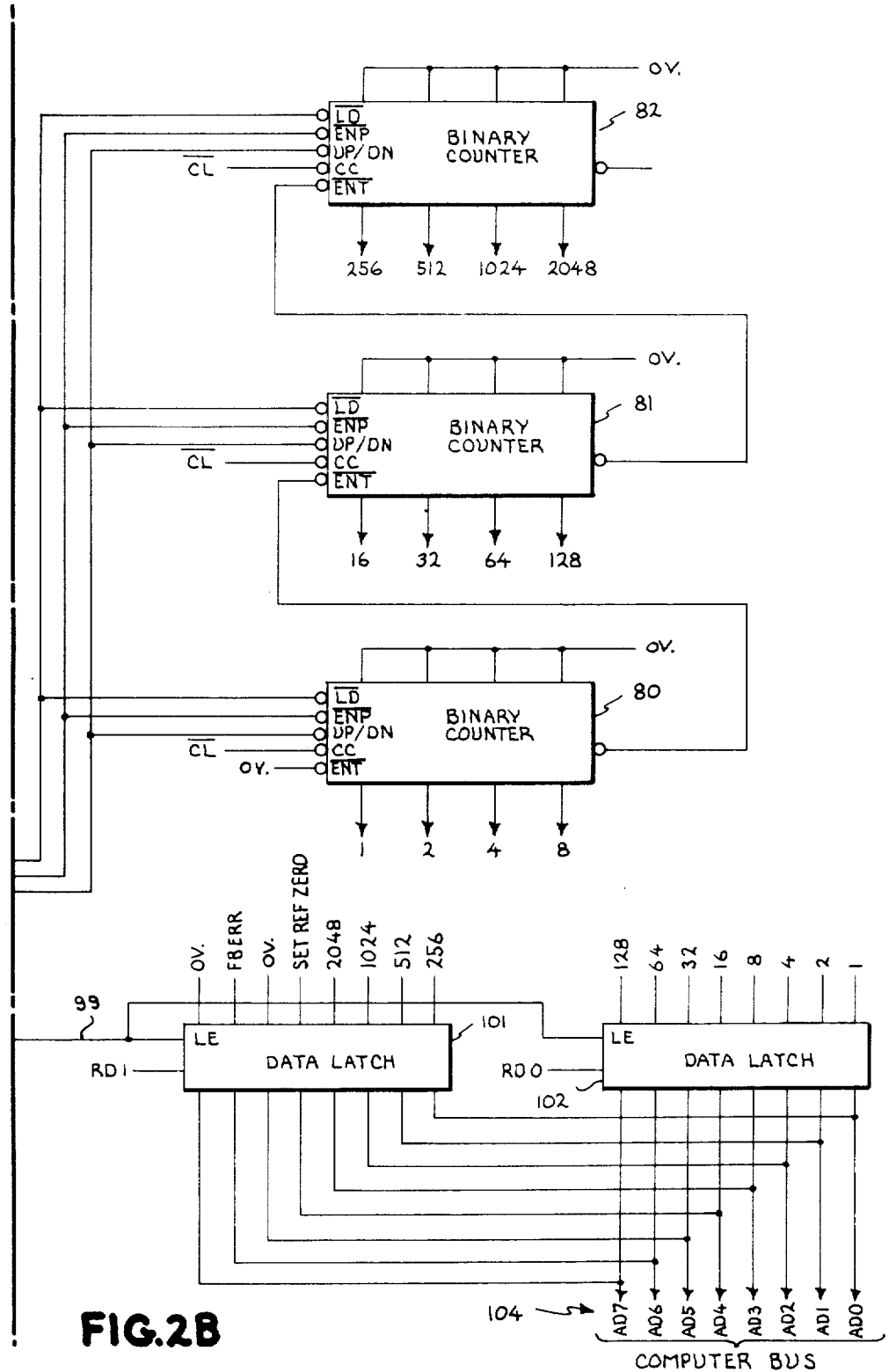

Referring to FIGS. 2A and 2B (which illustrate the embodiment of FIG. 1 in greater detail) the encoder signals PA and PB from the signal conditioning circuit 16 of FIG. 1 are initially applied as inputs to separate flip-flops of an octal D-type flip-flop 60. These flip-flops synchronize transitions of the input PA and PB signals with the clock cycle. The outputs of these flip-flops, appearing at lines 61 and 62, respectively, are each returned as inputs to a corresponding second set of flip-flops of the octal unit 60 wherein the signals are delayed and resynced with the clock cycle. The re-synced and delayed versions of the PA and PB signals appear, respectively, at output lines 63 and 64.

The outputs from the first pair of flip-flops (associated with the PA signal and appearing at lines 61 and 63) are applied to a first exclusive OR gate 66; the output from the second pair of flip-flops (associated with PB signal and appearing at lines 62 and 64) are applied to a second exclusive OR gate 68. The timing of these signals is such that exclusive OR gate 66 produces a pulse with each amplitude transition of the input PA signal, and exclusive OR gate 68 produces a pulse with each amplitude transition of the input PB signal. The pulses from gate 66 are applied to one input of the third exclusive OR gate 70 while the pulses from gate 68 are applied to the other input of the same gate. The output from gate 70 therefore is a string of pulses in which each pulse represents an amplitude transition of the PA or PB signal.

Exclusive OR gate 71 receives the synchronized PA signal from the flip-flop output at line 61 and the synced and delayed PB signal from line 64. The output of exclusive OR gate 71 is a pulse signal which is high or low depending on the phase relationship of the PA and PB signals, and therefore, on the direction of movement of the monitored object.

Figure 3:
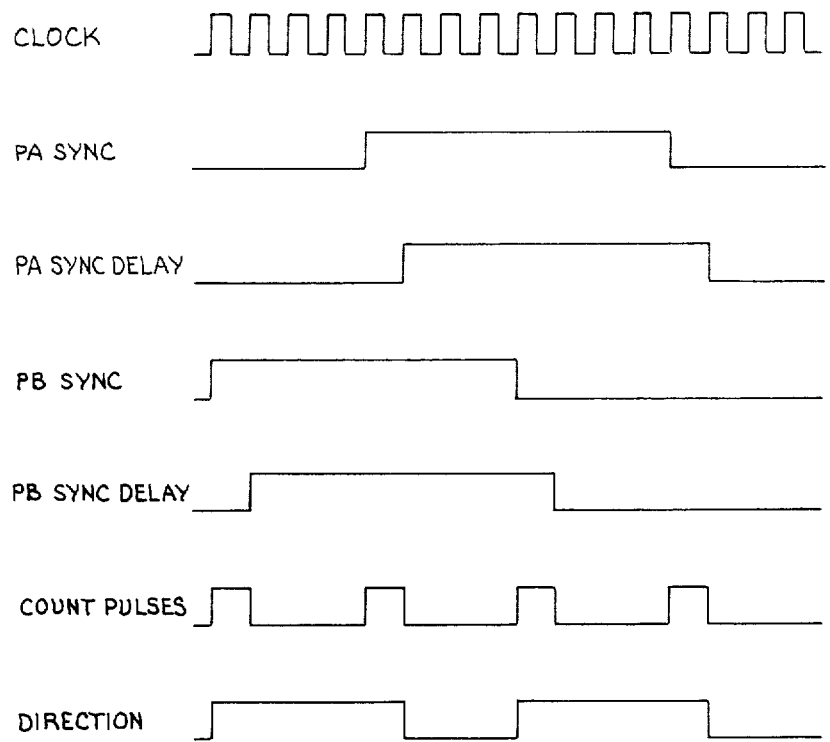
FIG. 3 is a timing diagram illustrating timing relationships for a portion of the circuitry of FIGS. 2A and 2B associated with the encoder mode.

FIG. 3 illustrates the encoder wave forms and their timing relationships for one direction of motion and at some particular rate of speed.

It will be recalled that the mode of operation may be manually selectable. Generally, the selection is made by application of an appropriate signal $\overline{RSLVR}$ at input line 72. This signal is inverted twice, by inverters 73 and 74, to produce signals RSLVRA and $\overline{RSLVRA}$.

With the system in the encoder mode, the $\overline{RSLVRA}$ signal is applied at line 76 to inform a pair of D-flip-flops 77 and 78 that the encoder transducer is in use and, accordingly, that the direction signal from gate 71 and the count pulses from gate 70 are to be clocked through the flip-flops 77 and 78, respsectively.

The pulses from flip-flop 78 are applied to the enabling inputs of three 4-bit binary counters 80, 81, and 82 while, simultaneously, the direction pulse from flip-flop 77 is applied to the up/down input of each counter. Thus the counters are in a reversing mode with the transition pulses adding or subtracting to the count depending on the direction of motion sensed by the encoder.

The counters 80–82 may be initially set to zero at some reference position when in the encoder mode so that the present position is always indicated by the count value. For this purpose "Set Ref. Zero" is applied as one input of NAND gate 84. As will be explained, this signal is preferably supplied from the computer, initiated at an operator's discretion.

With the simultaneous presence of signals PA, PB, and PZ, and when in the encoder mode ($\overline{RSLVRA}$ signal is true), AND gate 85 provides an output pulse. This pulse is synchronized and delayed in a pair of flip-flops of the octal flip-flop unit 60 producing pulses (one delayed from the other) at lines 86 and 87. The pulse at line 87 is inverted by inverter 88 and then applied as one input to NAND gate 84. The pulse at line 86 is applied to the remaining, third input of NAND gate 84. The concurrence of these signals with the "Set Ref. Zero" signal produces a relatively narrow pulse applied through NAND gate 90 to the $\overline{LD}$ inputs of counters 80–82 causing the counters to be reset to zero. The $\overline{LD}$ signal occurs at the same time that the count signal (at the ENP terminals) occurs, resulting from the transition of PA or PB, and the count which otherwise would result does not change the counters from zero.

When in the resolver mode, the $\overline{RSLVR}$ signal is low at line 76, causing the flip-flops 77 and 78 to direct the counters 80–82 into an up-counting mode. The counters thus become reference counters, counting up on the clock signal applied at terminals CC of each counter, 80–82. A clock is not specifically illustrated in FIGS. 2A and 2B. Clock inputs, where necessary, are labeled CL and $\overline{CL}$, indicating the clock signal in inverted and non-inverted form. For the embodiment of the invention illustrated, a clock operating at a frequency, for example, of 12 MHz would be appropriate.

The counters 80–82 count up during each interval between sync pulses from the resolver. The sync signal is brought in to an AND gate 91, a synchronizing flip-flop 92, and then is applied (as a signal, $\overline{SYNCA}$) to NAND gate 90. An $\overline{LD}$ signal is thus generated at the sync signal rate, causing the counters 80–82 to be reset to zero with each occurrence of the resolver sync signal. After being reset the counters are then free to begin counting up on the clock signal once again.

With the occurrence of the WS signal from the resolver it is desired to latch the counter value as an indication of the present position of the monitored object. The WS signal is initially synchronized and delayed by a pair of flip-flops included in the octal flip-flop unit 60, providing a sync delayed signal at line 93. This signal is applied to inverter 94 and then, following inversion, as one input to AND gate 95. The WS signal, having been synchronized in the wave shaper circuit 20 of FIG. 1, is applied directly as the other input to AND gate 95. The result is an output pulse which may be referred to herein as the WSPLS pulse. This wave shaper pulse is applied to a D-type flip-flop 96, being thereby resynchronized with the clock. The output of flip-flop 96 is applied to NAND gate 97 which, when in the resolver mode, passes the pulses to an AND gate 98. AND gate 98 clocks the pulse through on one-half cycle of the clock, creating a latch enable signal at line 99.

Data latches 101 and 102 are each 8-bit latches connected to the counters 80-82 to hold the present position count (at the appropriate time) developed in the counter. In the resolver mode the latch enable signal derived from the WSPLS signal as described above, briefly enables the latches substantially simultaneously with the trailing edge of the WS signal. The present position count is then captured and held in the latches 101 and 102 as the first 12 bits of the 16 bits of the latches.

Flip-flop 96 in combination with NAND gate 97 and AND gate 98 provide synchronization so that the latch enable signal occurs on that half cycle of the clock opposite to the one on which the counters 80-81 are being clocked. This insures that latching of data from the counters 80-82 occurs only after the counters have settled out.

In the encoder mode, the latches 101 and 102 are operated differently. In that mode the latches are enabled for a half of each clock cycle so that, until data is requested by the computer, the count in the latches 101 and 102 tracks that of the counters 80-82. Thus, in the encoder mode, the RSLVRA input to NAND gate 97 is low causing its output to be at a high level. This ouput signal is applied as one input of AND gate 98. The other, non-clock input is also high so that a latch enable pulse is created each half clock cycle. The present position count is thus repeatedly latched into data latches 101 and 102. The output lines of the data latches 101 and 102 are connected to the multiplexed address and data bus (computer bus) 104 for periodic transfer of the present position data (from either transducer) into the control computer.

The position data from the latches is transferred into the computer on a READ command from the computer. As will be further described below, the position data from the latches 101 and 102 is read in two bytes. Generally, data from latch 102, containing the lower order byte, is read first upon the occurrence of an RD0 signal. The RD0 signal is applied simultaneously to a hold between bytes flip-flop 106 and to the data latch 102. The RD0 signal sets the flip-flop 106 and, via AND gate 98, produces a signal to latch the data in both data latches 101 and 102. The RD0 signal at latch 102 also enables the lower order byte of data on to the computer bus 104. Subsequently, the RD1 signal is generated to enable the higher order byte from latch 101 on to the computer bus 104.

The RD1 signal is also simultaneously applied to flip-flop 107 and latch 101. In order to hold the data in latches 101 and 102 until both bytes of data are read, flip-flop 107, flip-flop 108, and AND gate 109 operate in conjunction to create a clearing pulse on the trailing edge of the RD1 signal. This clears the hold between bytes flip-flop 106 only after both bytes of data have been read and thereby insures that the latches 101 and 102 hold the data for a sufficient period of time.

Figure 4:
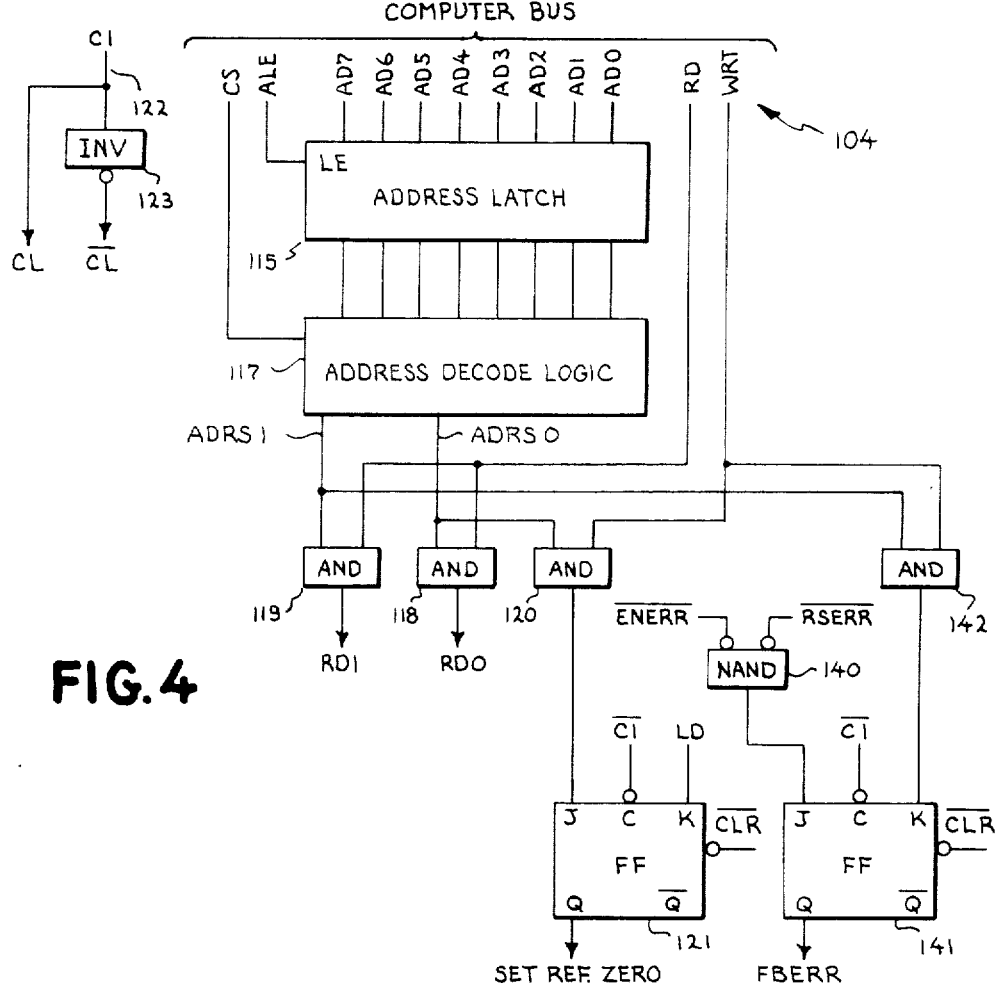
FIG. 4 is a schematic circuit diagram of another portion of an interfacing system in accordance with the invention as illustrated in FIG. 1.

FIG. 4 illustrates means by which the READ signals RD0 and RD1 are generated and, in addition, shows an aspect of the invention according to which errors associated with either of the two types of transducers are detected. This latter aspect of the invention has not heretofore been discussed herein.

In FIG. 4, the computer bus 104 includes, in addition to the multiplexed address and data lines AD0-AD7, lines from the control computer for: (1) address latch enable, ALE; (2) chip select, CS; (3) a read command, RD; and (4) a write command, WRT. The computer first issues the ALE and CS signals alerting the interfacing system of the invention that it is being addressed. On a READ cycle, for example, the address is latched in address latch 115 and decoded by address decode logic 117 producing, in sequence, an ADRS0 signal and an ADRS1 signal. These signals are combined with the READ signal, RD, from the computer in AND gates 118 and 119, respectively, to produce the RD0 and RD1 signals at appropriate times. These signals are in turn applied, as described above, to the data latches 101 and 102 and to the flip-flops 106 and 107 of FIGS. 2A and 2B. The write signal, WRT, from the computer is combined with the Address Zero, ADRS0, signal in AND gate 120 to set flip-flop 121 to create the "Set Zero Ref." signal discussed above. Thus, operating personnel, working through the computer control system, are able to initialize the encoder mode at some reference point.

FIG. 4 additionally shows the clock input at line 122 and an inverter 123 for producing the two clock signals $\overline{CL}$ and CL.

A feature of the present invention is the ability to detect certain errors which may occur in the transducer signals. For example, in handling signals from the encoder, various effects may cause what appears to be substantially simultaneous amplitude transitions of the PA and PB signals. In the event of such errors, exclusive OR gates 66 and 68 of FIG. 2A both produce pulses at substantially the same time, activating the NAND gate 75 to produce an encoder error indicative signal, $\overline{ENERR}$.

Figure 5:
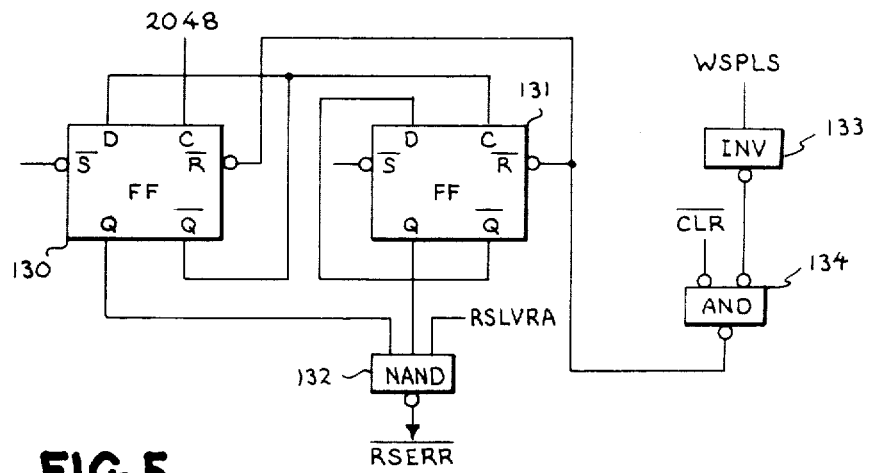
FIG. 5 is a schematic circuit diagram illustrating circuitry for detecting errors in resolver signals.

FIG. 5 illustrates circuitry for error detection in the resolver mode. From the counter 82 of FIG. 2B, pulses from the signal indicating 2048 counts are supplied to one input of a two-byte counter comprised of flip-flops 130 and 131. The wave shaper pulse, WSPLS provides a repetitive reset signal for this counter circuitry. Thus, the counter will count out, generating a signal, $\overline{RSERR}$, indicating loss of the resolver signals unless the wave shaper pulse (derived from the resolver input) occurs prior to the countout. A NAND gate 132 enabled by the RSLVRA signal, is triggered to produce the error signal. The wave shaper pulse is brought in through an inverter 133 and the NAND gate 134. The $\overline{CLR}$ signal indicated in FIG. 5, as in other drawing figures, is a signal used to initialize the functions of the interfacing system of the illustrated emodiment of the invention.

Referring again to FIG. 4, the error indicative signals, $\overline{ENERR}$ and $\overline{RSERR}$, are provided to a NAND gate 140. In the event an error is detected in either set of transducer signals, the flip-flop 141 is set, producing a signal FBERR which is latched as one bit into data latch 101 of FIG. 2B. The error indication is then transferred into the control computer so that appropriate action can be taken. When the error is properly responded to, the error signal is cleared by writing out of the computer to activate AND gate 142 which then clears flip-flop 141. The $\overline{RSERR}$ signal also serves as an input to NAND gate 97 of FIG. 2A so that the data latches 101 and 102 are latched in the event an error is detected in the transducer signals.

The foregoing has described a preferred embodiment of the invention. It will be apparent to those of skill in the art that various other embodiments may be realized which will remain within the concept and scope of the invention. Accordingly, it is intended that the invention be not limited by the details in which it has been described but that it encompass all within the purview of the following claims.

I claim:

1. Apparatus for selectively interfacing signals to a computer from either a first or a second transducer disposed for monitoring the relative position of an object, said second transducer being of the type arranged to provide a reference signal and a position signal whose phase relationship with said reference signal is indicative of position, and said first transducer being of the type providing A and B signals whose phase relationship is indicative of directional changes in position and whose number of transitions in amplitude occuring relative to a marker signal is indicative of position, comprising:
    (a) a digital counter operable in a first mode as a reversing counter and operable in a second mode as a reference counter, said counter providing an output count which in each mode is indicative of the object's position;
    (b) mode select means for causing said counter to operate in the first mode or the second mode depending on whether signals from said first transducer or said second transducer are to be interfaced to said computer;
    (c) data latching means connected between said computer and said counter for receiving the output count from said counter and for holding the output count for a commanded transfer to said computer;
    (d) means providing a clock signal for signal synchronization and for reference counting;
    (e) means receiving said A and B signals from said first transducer and responsive thereto to generate a count signal indicative of said transitions of said A and B signals, said count signal being counted up or down by said counter depending on the phase relationship said A and B signals when said counter is in said first mode;
    (f) means receiving the reference signal of said second transducer and responsive thereto to cause said counter to reset to a zero count upon each occurrence of said reference signal and then to allow said counter to begin counting said clock signal when said counter is in said second mode;
    (g) means receiving the position signal of said second transducer and responsive thereto to generate a control signal causing said data latching means to hold the output count of said counter occuring substantially simultaneously with said position signal when said counter is in said second mode;
    (h) data transfer control means responsive to a read command from said computer when said counter is in said second mode, for carrying out said commanded transfer of the position indicative count to said computer, and responsive to said read command from said computer when said counter is in said first mode, for latching and carrying out said commanded transfer of the position indicative count to said computer.

2. The apparatus of claim 1 further including means to zero said counter when in said first mode to establish a reference point against which changes in the position of said object may be determined.

3. The apparatus of claim 2 further including error detecting circuitry for detecting errors in signals indicative of those signals provided by said first and second transducers.

4. The apparatus of claim 3 wherein said data latching means comprises a pair of data latches for holding the output count in two bytes, and said data transfer control means includes means for receiving said read signal and an address signal from the computer to generate a read-zero signal and a read-one signal, and means responsive to said read-zero and read-one signals to cause said data latching means to hold the output count until both bytes of said pair have been transferred to the computer.

5. The apparatus of claim 4 wherein said error detecting circuitry comprises:
    (a) means responsive to an elapsed time period during which said control signal is not generated, to provide a first error indicative signal; and
    (b) means responsive to substantially simultaneous transitions of signals indicative of said A and B signals, to provide a second error indicative signal.

6. The apparatus of claim 5 wherein said mode select means includes a gate circuit receiving signals indicative of said A and B signals and responsive to the phase relationship thereof to automatically direct said counter to count said count signal up or down depending on the direction of movement of said object.

7. The apparatus of claim 6 wherein said digital counter comprises a 12-bit synchronous counter.

8. An interfacing system for selectively interfacing signals to a control computer of a numerical control system from either an encoder providing Phase A and Phase B signals and a marker signal or from a resolver providing a reference signal and a position signal, the encoder or resolver being disposed to monitor the position of an object whose position is controlled by the numerical control system, comprising:
    (a) a digital counter operable in a first mode as a reversing counter when signals from the encoder are to be interfaced and operable in a second mode as a reference counter counting a clock signal when signals from the resolver are to be interfaced, the counter providing a count value which in each mode is indicative of the present position of the object;
    (b) a data latch connected between the counter and the control computer for receiving the count value from the counter and for holding it to be read by the computer;
    (c) means operative in combination with the counter in the first mode for receiving the phase A and phase B signals and responsive thereto to produce a countable first signal wherein each count is indicative of a change in position of said object and to produce a second signal indicative of the direction of such change, said first signal being supplied to the counter and thereby counted and said second signal being supplied to the counter and determining the up or down count direction thereof;
    (d) means operative in combination with the counter in the second mode for receiving the reference signal and responsive thereto to cause the counter to be reset to a zero count value on each occurrence of the reference signal;

(e) means operative in combination with the counter in the second mode for receiving the position signal and responsive thereto to cause the data latch to obtain and hold the count value occurring substantially simultaneously with the postion signal;

(e) data transfer control means for receiving a read command from the computer and responsive thereto to cause said data latch to latch-in the present position count value from the counter when the counter is in the first mode and to allow the computer to read the present position count when the counter is in said first or second mode.

9. The interfacing system of claim 8 further including means operable in combination with the counter in said first mode to cause the counter to reset to a zero count indicative of a reference position of said object, upon an operator's command.

10. The interfacing system of claim 9 wherein said counter comprises a 12-bit synchronous counter and said data latch comprises first and second 8-bit data latches.

11. The interfacing system of claim 10 wherein said data transfer control means includes:

(a) means responsive to said read command to transfer said count value from said first and second 8-bit latches to the computer in two sequential bytes; and (b) means responsive to said read command to cause said data latches to retain the present position count value until the transfer of both bytes is complete.

12. The interfacing system of claim 11 further including:

(a) means for detecting the substantially simultaneous occurrence of phase A and phase B signals as an indication of error in the encoder signals; and (b) means for detecting loss of the position signal during a predetermined time period as an indication of error in the resolver signals.

* * * * *